(12) United States Patent
Deng et al.

(10) Patent No.: US 12,742,809 B2
(45) Date of Patent: Sep. 22, 2026

(54) METHOD AND DEVICE FOR LOCATING FAULT, COMPUTER DEVICE, AND STORAGE MEDIUM

(71) Applicant: Sungrow Power Supply Co., Ltd., Hefei (CN)

(72) Inventors: Kai Deng, Hefei (CN); Le Li, Hefei (CN); Shun Zhou, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 163 days.

(21) Appl. No.: 18/734,180

(22) Filed: Jun. 5, 2024

(65) Prior Publication Data

US 2025/0172602 A1 May 29, 2025

(30) Foreign Application Priority Data

Nov. 27, 2023 (CN) ........................ 202311622317.4

(51) Int. Cl.
*G01R 31/08* (2020.01)
*H02H 3/00* (2006.01)

(52) U.S. Cl.
CPC ......... *G01R 31/086* (2013.01); *G01R 31/088* (2013.01); *H02H 3/00* (2013.01)

(58) Field of Classification Search
CPC .... G01R 31/086; G01R 31/088; G01R 31/36; G01R 31/12; G01R 31/08; H02H 3/00; H02H 3/042; H02H 7/18; H02H 3/087; H02H 1/0015; H02H 1/0007; H02H 7/267; H02J 7/60
See application file for complete search history.

(56) References Cited

FOREIGN PATENT DOCUMENTS

EP 3618218 A1 3/2020

OTHER PUBLICATIONS

Combined Search and Examination Report for Great British Application GB2407029.4, dated Nov. 4, 2024.

*Primary Examiner* — Daniel Cavallari
(74) *Attorney, Agent, or Firm* — Wolf, Greenfield & Sacks, P.C.

(57) ABSTRACT

A method and a device for locating a fault are provided. The method is applied to an energy storage system, which includes a first battery module, a second battery module, a sensor, and a PCS. A first branch where the first battery module is arranged and a second branch where the second battery module is arranged are connected in parallel and are electrically connected to the sensor. The PCS is electrically connected to the first and the second battery modules. The method includes: switching the first and second branches to a target state and acquiring a second signal sensed by the sensor in the target state, in response to a first signal sensed by the sensor meeting a first preset condition; locating the fault according to the first signal and the second signal; and disconnecting a branch where the fault is located.

9 Claims, 10 Drawing Sheets

Switch a first branch and a second branch to respective target states and acquire a second signal sensed by a sensor in the target mode in response to a first signal sensed by the sensor meeting a first preset condition — S110

Locate a fault according to the first signal and the second signal — S120

Disconnecting a branch where the fault is located — S130

METHOD AND DEVICE FOR LOCATING FAULT, COMPUTER DEVICE, AND STORAGE MEDIUM

The present application claims priority to Chinese Patent Application No. 202311622317.4, titled "METHOD AND DEVICE FOR LOCATING FAULT, COMPUTER DEVICE, AND STORAGE MEDIUM", filed on Nov. 27, 2023 with the China National Intellectual Property Administration, which is hereby incorporated by reference in its entirety.

FIELD

The present disclosure relates to the technical field of energy storage, and in particular to a method and a device for locating a fault, a computer device, a storage medium and a computer program product.

BACKGROUND

A power conversion system (PCS) may be connected to multiple branches. For example, one PCS is connected to two battery branches. A malfunction in the PCS that is in operation may result in arcing, which is an electrical discharge resulted from a breakdown of insulation between electrical devices or components in a circuit or the insulation being subjected to high voltage.

At present, a sensor is arranged in the circuit to inspect current. The power conversion system is directly shut down in case of arcing, thereby avoiding damages to the circuit. However, this solution ends in failure to precisely locate the malfunction. The shutdown of the power conversion system affects power production.

SUMMARY

In view of this, a method and a device for locating a fault, a computer device, a storage medium and a computer program product are provided according to the present disclosure, to precisely locate a malfunction. The technical solution according to the present disclosure is applicable to various scenarios.

In a first aspect, a method for locating a fault is provided according to the present disclosure. The method is applied to an energy storage system. The energy storage system includes a first battery module, a second battery module, a sensor, and a power conversion system. A first branch where the first battery module is arranged and a second branch where the second battery module is arranged are connected in parallel and are electrically connected to the sensor. The power conversion system is electrically connected to the first battery module and the second battery module. The method includes: switching the first branch and the second branch to a target state and acquiring a second signal sensed by the sensor in the target state, in response to a first signal sensed by the sensor meeting a first preset condition; locating the fault according to the first signal and the second signal; and disconnecting a branch where the fault is located.

In an embodiment, the switching the first branch and the second branch to the target state and acquiring the second signal sensed by the sensor in the target state includes: disconnecting the first branch, connecting the second branch and acquiring a first candidate signal sensed by the sensor; and determining the first candidate signal as the second signal, in response to the first candidate signal meeting a second preset condition. The locating the fault according to the first signal and the second signal includes: determining that the fault occurs in the first branch, in response to the first signal meeting the first preset condition and the second signal meeting the second preset condition.

In an embodiment, the switching the first branch and the second branch to the target state and acquiring the second signal sensed by the sensor in the target state includes: disconnecting the first branch, connecting the second branch and acquiring a first candidate signal sensed by the sensor; connecting the first branch, disconnecting the second branch and acquiring a second candidate signal sensed by the sensor, in response to the first candidate signal meeting the first preset condition; and determining the second candidate signal as the second signal, in response to the second candidate signal meeting a second preset condition. The locating the fault according to the first signal and the second signal includes: determining that the fault occurs in the second branch, in response to the first signal meeting the first preset condition and the second signal meeting the second preset condition.

In an embodiment, the second signal numbers more than one. The switching the first branch and the second branch to the target state and acquiring the second signal sensed by the sensor in the target state includes: disconnecting the first branch, connecting the second branch and acquiring a first candidate signal sensed by the sensor; connecting the first branch, disconnecting the second branch and acquiring a second candidate signal sensed by the sensor, in response to the first candidate signal meeting the first preset condition; and determining the first candidate signal and the second candidate signal as the second signal, in response to the second candidate signal meeting the first preset condition.

In an embodiment, the locating the fault according to the first signal and the second signal includes: determining a first difference between the first signal and the first candidate signal, and determining a second difference between the first signal and the second candidate signal; and locating the fault according to a relationship between the first difference, the second difference and a preset change range.

In an embodiment, the locating the fault according to the relationship between the first difference, the second difference and the preset change range includes: determining that the fault occurs in the power conversion system in response to a fact that the first difference and the second difference are both within the preset change range; and/or determining that the fault occurs in the first branch and the second branch in response to a fact that the first difference and the second difference are both outside the preset change range.

In a first aspect, a device for locating a fault is provided according to the present disclosure. The device is applied to an energy storage system. The energy storage system includes a first battery module, a second battery module, a sensor, and a power conversion system. A first branch where the first battery module is arranged and a second branch where the second battery module is arranged are connected in parallel and are electrically connected to the sensor. The power conversion system is electrically connected to the first battery module and the second battery module. The device includes: an acquiring module configured to switch the first branch and the second branch to a target state and acquire a second signal sensed by the sensor in the target state, in response to a first signal sensed by the sensor meeting a first preset condition; a locating module configured to locate the fault according to the first signal and the second signal; and a control module configured to disconnect a branch where the fault is located.

In an embodiment, the acquiring module includes: a first control submodule configured to disconnect the first branch, connect the second branch and acquire a first candidate signal sensed by the sensor; and a first determining submodule configured to determine the first candidate signal as the second signal, in response to the first candidate signal meeting a second preset condition. The locating module includes a second determining submodule configured to determine that the fault occurs in the first branch, in response to the first signal meeting the first preset condition and the second signal meeting the second preset condition.

In an embodiment, the control module includes a second control submodule configured to disconnect the first branch, connect the second branch and acquire a first candidate signal sensed by the sensor; a third control submodule configured to connect the first branch, disconnect the second branch and acquire a second candidate signal sensed by the sensor, in response to the first candidate signal meeting the first preset condition; and a third determining submodule configured to determine the second candidate signal as the second signal, in response to the second candidate signal meeting a second preset condition. The locating module includes a fourth determining submodule configured to determine that that the fault occurs in the second branch, in response to the first signal meeting the first preset condition and the second signal meeting the second preset condition.

In an embodiment, the second signal numbers more than one. The control module includes: a fourth control submodule configured to disconnect the first branch, connect the second branch and acquire a first candidate signal sensed by the sensor; a fifth control submodule configured to connect the first branch, disconnect the second branch and acquire a second candidate signal sensed by the sensor, in response to the first candidate signal meeting the first preset condition; and a fifth determining submodule configured to determine the first candidate signal and the second candidate signal as the second signal, in response to the second candidate signal meeting the first preset condition.

In an embodiment, the locating module includes: a sixth determining submodule configured to determine a first difference between the first signal and the first candidate signal, and determine a second difference between the first signal and the second candidate signal; and a seventh determining submodule configured to locate the fault according to a relationship between the first difference, the second difference and a preset change range.

In an embodiment, the seventh determining submodule includes: a first determining unit configured to determine that the fault occurs in the power conversion system in response to a fact that the first difference and the second difference are both within the preset change range; and/or a second determining unit configured to determine that the fault occurs in the first branch and the second branch in response to a fact that the first difference and the second difference are both outside the preset change range.

In a third aspect, a computer device is also provided according to the present disclosure. The computer device includes a memory and a processor. The memory stores a computer program, and the processor executes the computer program to implement the method described in the first aspect.

In a fourth aspect, a computer-readable storage medium is also provided according to the present disclosure. The computer-readable storage medium has a computer program stored thereon. When the computer program is executed by a processor, the method described in the first aspect is implemented.

In a fifth aspect, a computer program product is also provided according to the present disclosure. The computer program product includes a computer program that implements the method described in the first aspect when executed by a processor.

A method for locating a fault is provided according to the present disclosure. The method is applied to an energy storage system. The energy storage system includes a first battery module, a second battery module, a sensor, and a power conversion system. A first branch where the first battery module is arranged and a second branch where the second battery module is arranged are connected in parallel and are electrically connected to the sensor. The power conversion system is electrically connected to the first battery module and the second battery module. When the first signal sensed by the sensor meets the first preset condition, the first branch and the second branch are switched to the target state, the fault is located based on the second signal sensed by the sensor in the target state, and the branch where the fault is located is disconnected. With this solution, the fault in the energy storage system can be accurately located based on the signals sensed by the sensor and by switching between states of the two branches to facilitate removal of the fault, instead of shutting down the power conversion system directly. Therefore, the fault can be located accurately and the energy storage system can operate properly throughout, resulting in no reduction in the power production. This solution is applicable to various scenarios. Moreover, no additional sensor or fault detection device is involved, and the fault can be located by simply switching between states of the branches at a low price.

BRIEF DESCRIPTION OF THE DRAWINGS

In order to more clearly describe the technical solutions in the embodiments of the present disclosure or the technical solutions in the conventional technology, drawings to be used in the description of the embodiments of the present disclosure or the conventional technology are briefly described hereinafter. It is apparent that the drawings described below are merely used for illustrating the embodiments of the present disclosure, and those skilled in the art can obtain other drawings according to the provided drawings without any creative effort.

DETAILED DESCRIPTION OF EMBODIMENTS

The present application is further described in detail below in combination with the drawings and embodiments, so that the purpose, technical solution and advantages of the present application are understandable. It should be understood that the specific embodiments described herein are only for explaining the present application instead of limiting the present application.

Figure 1:
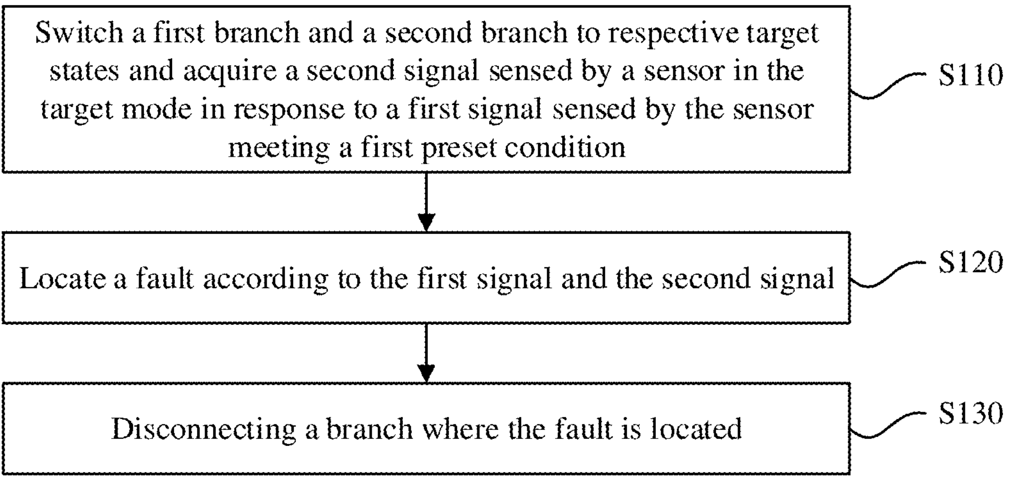
FIG. 1 is a flow chart illustrating a method for locating a fault in an embodiment.

A method for locating a fault is provided in an embodiment, as shown in FIG. 1. The method is applied to an energy storage system, which includes a first battery module, a second battery module, a sensor, and a power conversion system. A first branch where the first battery module is arranged and a second branch where the second battery module is arranged are connected in parallel and then are electrically connected to the sensor. The power conversion system is electrically connected to the first battery module and the second battery module.

The method according to the embodiment is applied to an energy storage system with multiple branches. The energy storage system includes a first battery module and a second battery module. In one example, the energy storage system outputs power through the first battery module and/or the second battery module. The energy storage system further includes a sensor and a power conversion system. A first branch where the first battery module is arranged and a second branch where the second battery module is arranged are connected in parallel and then are electrically connected to the sensor. Details about the sensor depend on actual scenarios. For example, a voltage sensor is provided in order to locate the fault according to voltage. A current sensor is provided in order to locate the fault according to current. The power conversion system is electrically connected to the first battery module and the second battery module. The power conversion system can control the input and output parameters of the battery module as needed, and can also convert the output of the battery module and output the converted power.

Figure 2:
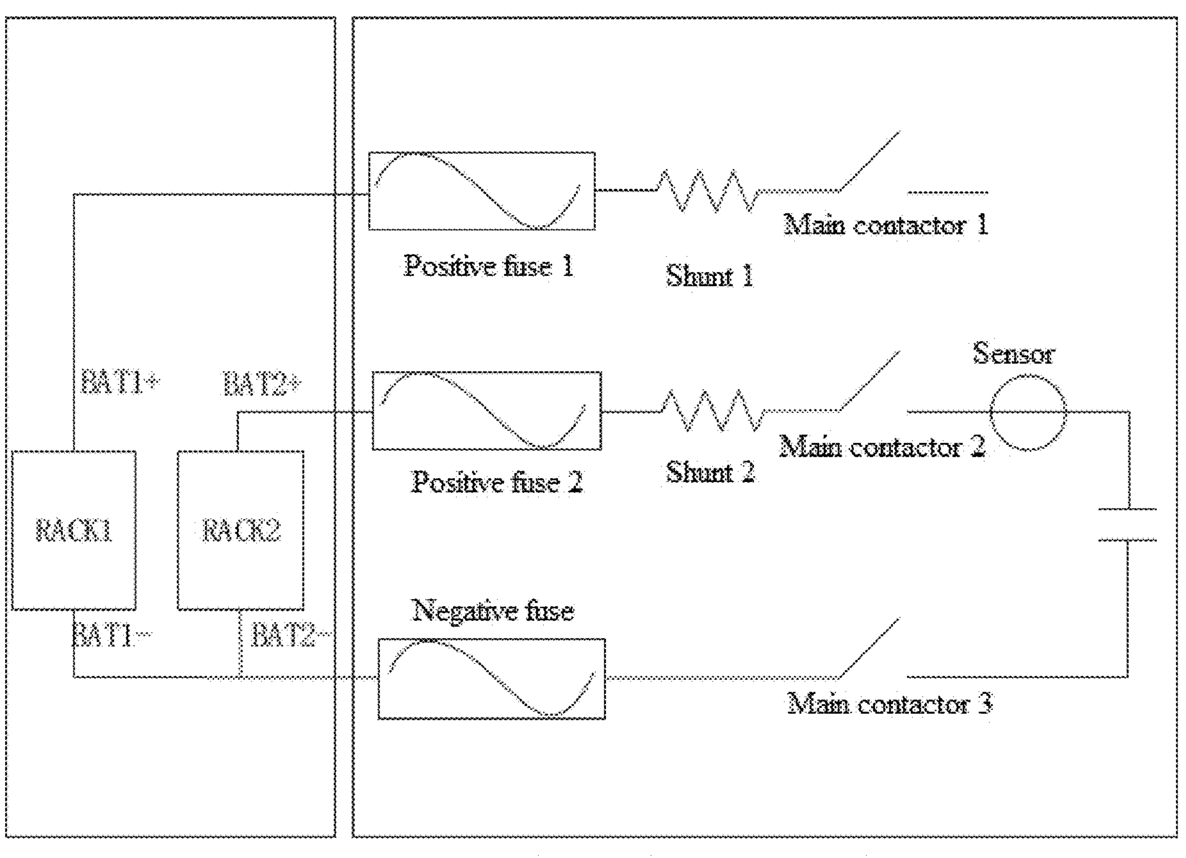
FIG. 2 is a structural diagram illustrating an energy storage system in an embodiment.

FIG. 2 is a structural diagram illustrating an energy storage system shown according to an embodiment. As shown in FIG. 2, the energy storage system includes two battery modules RACK1 and RACK2. The first battery module and the second battery module are connected in parallel and then are electrically connected to the sensor. In one example, the branch is provided with a contactor, for disconnecting and connecting the branch. The branch is further provided with a fuse connected to a positive terminal of the battery module, and a fuse connected to a negative terminal of the battery module, to protect the branch from overload. In one example, the branch is further provided with a shunt for precisely regulating current in order to sample direct current voltage. This is because a dual-branch PCS requires high precision. In this case, a sensor is added to extract alternating current voltage in order to detected an alternating current fault, for example, arcing. The dual-branch PCS can convert power outputted from two batteries.

The method includes the follows steps S110 to S130.

In step S110, the first branch and the second branch are switched to respective target states and a second signal sensed by the sensor in the target state is acquired, in response to a first signal sensed by the sensor meeting a first preset condition.

In an embodiment, the first branch and the second branch are switched to respective target states and the second signal sensed by the sensor in the target state is acquired, in response to the first signal sensed by the sensor meeting the first preset condition. The first preset condition depends on the signal features corresponding to the fault to be located in the actual scenarios. The first signal meeting the first preset condition indicates that a signal is detected by the sensor. In one example, the first preset condition is set according to the change in the current in case of arcing, in order to locate the arc. This is because the current and current waveform will undergo sudden changes in case of arcing. For example, the first preset condition is set to the signal value being greater than a preset threshold or the signal waveform conforming to the preset waveform, etc. The arcing is an electrical discharge resulted from a breakdown of insulation between electrical devices or components in a circuit or the insulation being subjected to high voltage. In this embodiment, it is determined whether the signal, sensed by the sensor when both the first branch and the second branch are connected, meets the first preset condition. The first signal sensed by the sensor meeting the first preset condition indicates that a fault occurs in the circuit, and then the first branch and the second branch are switched to the respective target states, to locate the fault. The target state depends on the actual scenario, and includes an ON state and an OFF state. The target state numbers one or more. For example, the first branch and the second branch are sequentially switched to multiple target states under preset control, and second signals sensed by the sensor in the multiple target states are acquired. In one example, the signal sensed by the sensor in the target state is filtered to obtain a signal that meets the requirements, which is determined as the second signal. In one example, the branch is switched between states by opening and closing the contactor in the branch.

In step S120, the fault is located according to the first signal and the second signal.

In the embodiment of the present disclosure, the fault is located according to the first signal and the second signal. The conditional is set according to the signal features when the fault is at different positions in the actual scenario, and the fault is located by combining the first signal and the second signal. The conditional may include but is not limited to whether the difference between the first signal and the second signal meets a preset condition, or whether the first signal and the second signal meet a preset condition, etc., depending on actual scenarios. In one example, the second signal includes multiple signals, and the fault is located by combining the multiple signals with the first signal.

In step S130, a branch where the fault is located is disconnected.

In the embodiment of the present disclosure, the branch where the fault is located is disconnected. After the fault is located, the branch where the fault is located is found and then is disconnected, to prevent the branch where the fault is located from affecting normal operation of the system. The branch where the fault is located numbers one or more branches, depending on actual scenarios. In one example, the energy storage system includes N branches. If a fault is detected in each of the N branches, the energy storage system is shut down. In another embodiment, the branch where the fault is located includes multiple sub branches, and the multiple sub branches are disconnected.

A method for locating a fault is provided according to the present disclosure. The method is applied to an energy storage system. The energy storage system includes a first battery module, a second battery module, a sensor, and a power conversion system. A first branch where the first battery module is arranged and a second branch where the second battery module is arranged are connected in parallel and are electrically connected to the sensor. The power conversion system is electrically connected to the first battery module and the second battery module. When the first signal sensed by the sensor meets the first preset condition, the first branch and the second branch are switched to the target state, the fault is located based on the second signal sensed by the sensor in the target state, and the branch where the fault is located is disconnected. In this embodiment, the fault in the energy storage system can be accurately located based on the signals sensed by the sensor and by switching between states of the two branches to facilitate removal of the fault, instead of shutting down the power conversion system directly. Therefore, the fault can be located accurately and the energy storage system can operate properly throughout, resulting in no reduction in the power production. This solution is applicable to various scenarios. Moreover, no additional sensor or fault detection device is involved, and the fault can be located by simply switching between states of the branches at a low price.

Figure 3:
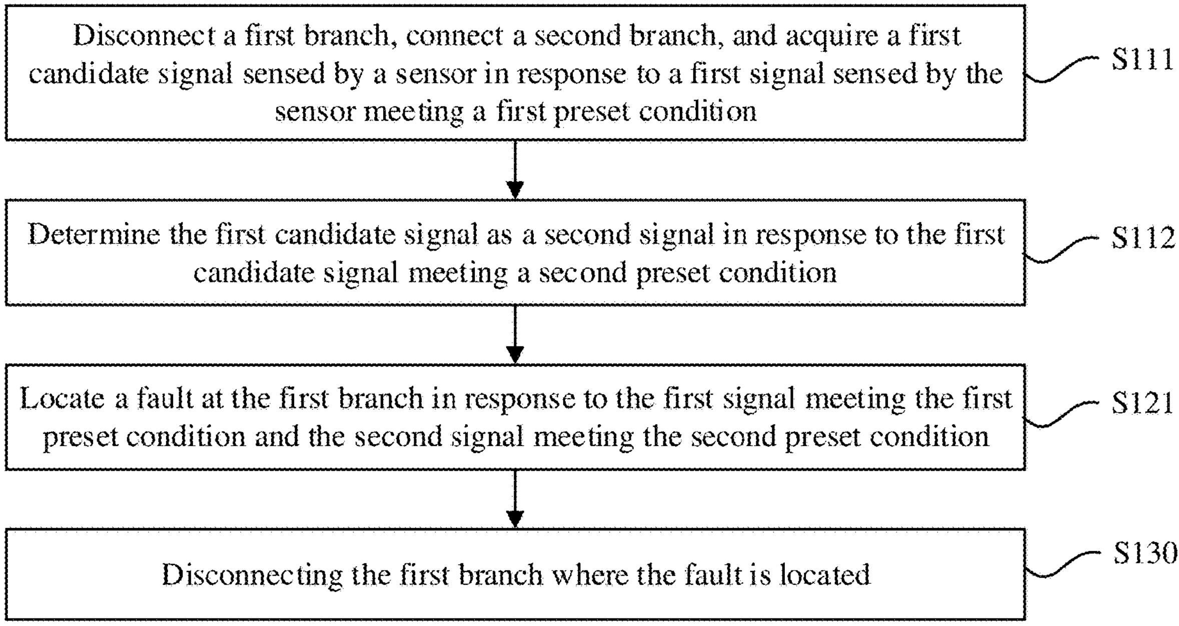
FIG. 3 is a flow chart illustrating the method for locating a fault in an embodiment.

In an embodiment, as shown in FIG. 3, the switching the first branch and the second branch to the respective target states and acquiring the second signal sensed by the sensor in the target state includes the follows steps S111 to S112.

In step S111, the first branch is disconnected and the second branch is connected, and a first candidate signal sensed by the sensor is acquired.

In step S112, the first candidate signal is determined as the second signal in response to the first candidate signal meeting a second preset condition.

The locating the fault according to the first signal and the second signal includes the following step S121.

In step S121, it is determined that the fault occurs in the first branch, in response to the first signal meeting the first preset condition and the second signal meeting the second preset condition.

In the embodiment of the present disclosure, the first branch is disconnected, the second branch is connected and then the first candidate signal sensed by the sensor is acquired, to determine the second signal. In response to the first candidate signal meeting the second preset condition, the first candidate signal is determined as the second signal. The second preset condition depends on actual scenarios. In this embodiment, the second preset condition is set according to the signal features in case of no fault occurs in the branch in the actual scenario. The first candidate signal meeting the second preset condition indicates that the first candidate signal indicates no fault. That is, no fault is detected when the first branch is disconnected. In response to the first signal meeting the first preset condition and the second signal meeting the second preset condition, that is, the fault is detected when both branches are connected while no fault is detected when the first branch is disconnected, it is determined that the fault occurs in the first branch.

In the embodiment of the present disclosure, when the first signal meets the first preset condition, the first branch is disconnected, the second branch is connected, and the first candidate signal is sensed by the sensor. The first candidate signal, when meeting the second preset condition, is determined as the second signal, and the fault determined as occurring in the first branch. In this embodiment, the first preset condition and the second preset condition are set. It can be determined, according to the signal sensed by the sensor when the first branch is disconnected and the first signal, whether the fault occurs in the first branch. The fault in the energy storage system can be accurately located by simply disconnecting the branch, to facilitate removal of the fault. Further, the energy storage system can operate properly throughout, resulting in no reduction in the power production. This solution is applicable to various scenarios.

Figure 4:
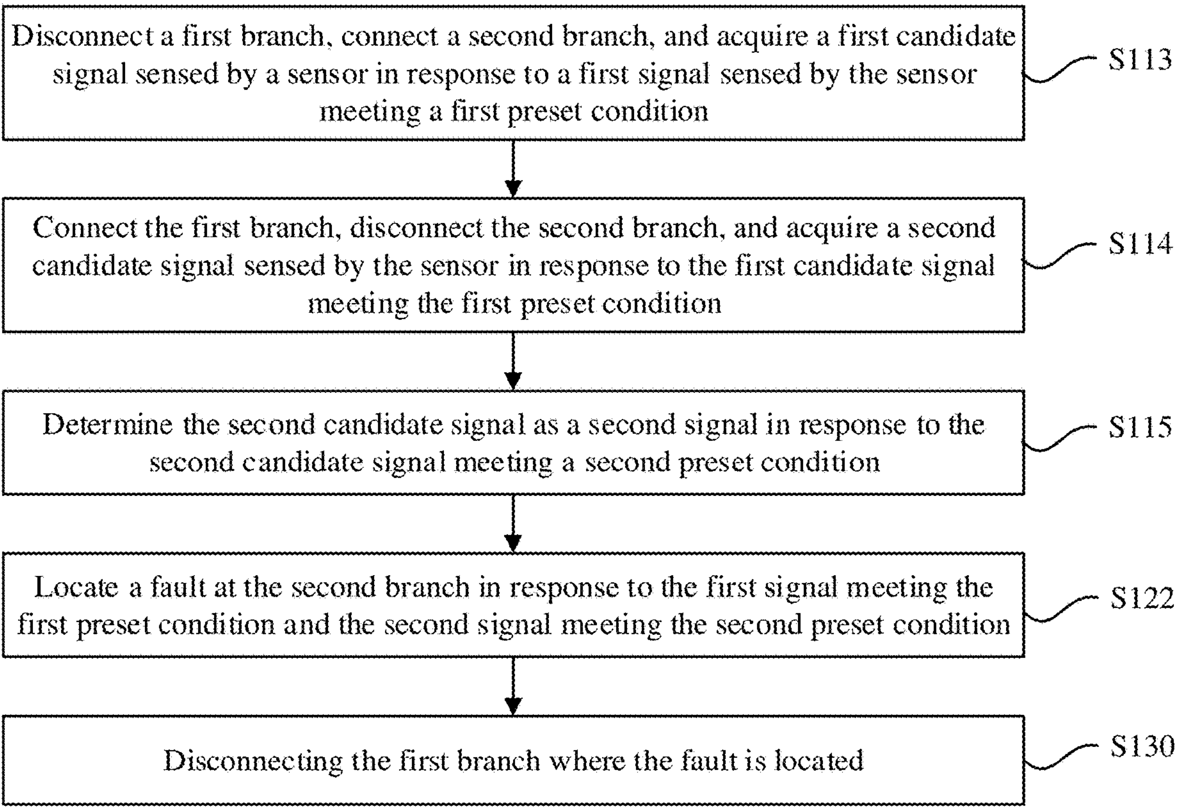
FIG. 4 is a flow chart illustrating the method for locating a fault in an embodiment.

In one embodiment, as shown in FIG. 4, the switching the first branch and the second branch to the respective target states and acquiring the second signal sensed by the sensor in the target state includes the follows steps S113 to S115.

In step S113, the first branch is disconnected and the second branch is connected, and a first candidate signal sensed by the sensor is acquired.

In step S114, the first branch to is connected, the second branch is disconnected and a second candidate signal sensed by the sensor is acquired, in response to the first candidate signal meeting the first preset condition.

In step S115, the second candidate signal is determined as the second signal, in response to the second candidate signal meeting a second preset condition.

The locating the fault according to the first signal and the second signal includes the following step S122.

In step S122, it is determined that the fault occurs in the second branch, in response to the first signal meeting the first preset condition and the second signal meeting the second preset condition.

In the embodiment of the present disclosure, the first branch is disconnected, the second branch is connected and then the first candidate signal sensed by the sensor is acquired, to determine the second signal. In response to the first candidate signal meeting the first preset condition, it is confirmed that the fault is currently detected. Then, the first branch is connected, the second branch is disconnected, and the second candidate signal is sensed by the sensor. In response to the second candidate signal meeting the second preset condition, the second candidate signal is determined as the second signal. The second preset condition depends on actual scenarios. In this embodiment, the second preset condition is set according to the signal features in case of no fault occurs in the branch in the actual scenario. The second candidate signal meeting the second preset condition indicates that the second candidate signal indicates no fault. That is, no fault is detected when the second branch is disconnected. In response to the first signal meeting the first preset condition and the second signal meeting the second preset condition, that is, the fault is detected when both branches are connected and is still detected when the first branch is disconnected, while no fault is detected when the second branch is disconnected, it is determined that the fault occurs in the second branch.

In the embodiment of the present disclosure, when the first signal meets the first preset condition, the first branch is disconnected, the second branch is connected, and the first candidate signal is acquired. When the first candidate signal meets the first preset condition, the second branch is disconnected, the first branch is connected, and the second candidate signal is acquired. When the second candidate signal meets the second preset condition, it is determined according to the second candidate signal and the first signal that the fault occurs in the second branch. In this embodiment, the signals sensed by the sensor when the two branches are in different states are acquired, to find the branch where the fault occurs according to the signals sensed by the sensor and the preset condition. When the signals sensed by the sensor when the two branches are in different states meet different conditions, it is confirmed that the fault occurs in one of the branches. Then, the branch where the fault is located is found according to the signals sensed by the sensor. The fault in a complex circuit, for example, the dual-branch energy storage system, can be accurately located, to facilitate removal of the fault. Further, the energy storage system can operate properly throughout, resulting in no reduction in the power production. This solution is applicable to various scenarios.

Figure 5:
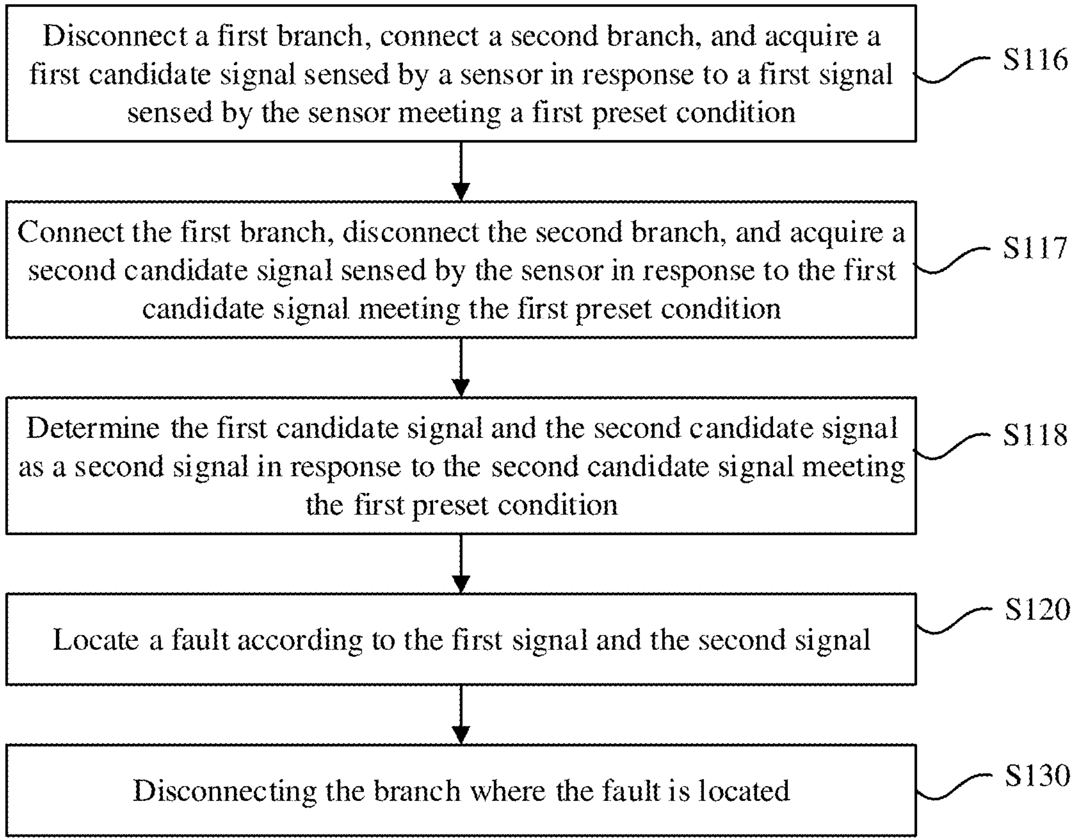
FIG. 5 is a flow chart illustrating the method for locating a fault in an embodiment.

In one embodiment, as shown in FIG. 5, the second signal numbers more than one, and the switching the first branch and the second branch to the respective target states and acquiring the second signal sensed by the sensor in the target state includes the follows steps S116 to S118.

In step S116, the first branch is disconnected and the second branch is connected, and a first candidate signal sensed by the sensor is acquired.

In step S117, the first branch is connected, the second branch is disconnected, and a second candidate signal sensed by the sensor is acquired, in response to the first candidate signal meeting the first preset condition.

In step S118, the first candidate signal and the second candidate signal are determined as the second signal, in response to the second candidate signal meeting the first preset condition.

In the embodiment of the present disclosure, the second signal numbers more than one. The first branch is disconnected, the second branch is connected and then the first candidate signal sensed by the sensor is acquired, to determine the second signal. In response to the first candidate signal meeting the first preset condition, it is confirmed that signal sensed by the sensor still indicates the fault. Then, the first branch is connected, the second branch is disconnected, and the second candidate signal is sensed by the sensor. In response to the second candidate signal meeting the first preset condition, it is confirmed that the signal currently sensed by the sensor still indicates the fault. That is, the signal sensed when both the first branch and the second branch are disconnected still indicates the fault. That the first candidate signal and the second candidate signal are determined as the second signal, and the fault is located according to the first signal, the first candidate signal and the second candidate signal.

In the embodiment of the present disclosure, the signals acquired when the two branches are in different states, when meeting the first preset condition, indicate the fault no matter which branch is disconnected. Therefore, the signals sensed by the sensor in the two states are determined as the second signal, to locate the fault according to the difference between the signals sensed by the sensor in different states and the preset condition. In this way, the fault can be accurately located based on the signals sensed by the sensor in various scenarios. This solution is suitable for a variety of complex scenarios such as a fault inside the energy storage system or the branch.

Figure 6:
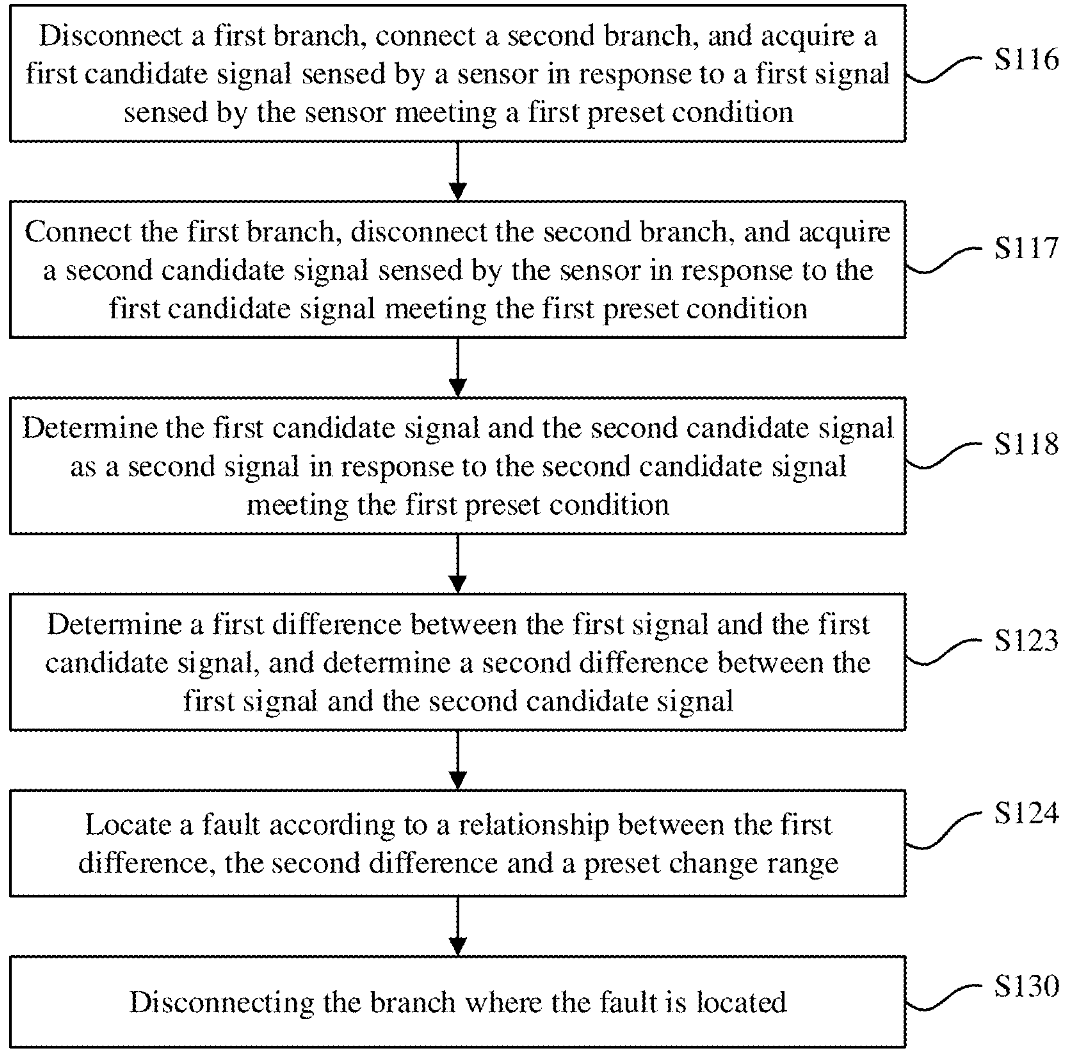
FIG. 6 is a flow chart illustrating the method for locating a fault in an embodiment.

In an embodiment, as shown in FIG. 6, the locating the fault according to the first signal and the second signal includes the follows steps S123 to S124.

In step S123, a first difference between the first signal and the first candidate signal is determined, and a second difference between the first signal and the second candidate signal is determined.

In step S124, the fault is located according to the relationship between the first difference, the second difference and a preset change range.

In the embodiment of the present disclosure, the second signal includes the first candidate signal and the second candidate signal. The first difference between the first signal and the first candidate signal and the second difference between the first signal and the second candidate signal are determined, to locate the fault according to the first signal and the second signal. The change in the signal under different states can be determined based on the first difference and the second difference. The fault is located according to the relationship between the first difference, the second difference and the preset change range. The preset change range depends on the change in the signal in different states in case of fault. The fault is located according to the relationship between the first difference, the second difference and the preset change range.

In another embodiment, the locating the fault according to the first signal and the second signal includes: acquiring a first signal value of the first signal; determining a preset signal value according to the number of branches in the energy storage system and the first signal value, for example, a ratio of the first signal value to the number of branches; and locating the fault according to a first candidate signal value of the first candidate signal, a second candidate signal value of the second candidate signal, and the preset signal value. In one example, the first candidate signal value and the second candidate signal value are both within the preset range of the preset signal value, and then it is confirmed that the fault occurs in the branch. Further, since the first candidate signal and the second candidate signal both indicate the fault, the fault is determined as occurring in the first branch and the second branch. When the first candidate signal value and the second candidate signal value are both outside the preset range of the preset signal value, it is confirmed that no branch malfunctions. Further, since the first candidate signal and the second candidate signal both indicate the fault, it is confirmed that the fault occurs in the power conversion system.

In the embodiment of the present disclosure, the second signal includes the first candidate signal and the second candidate signal. According to the first difference between the first signal and the first candidate signal, the second difference between the first signal and the second candidate signal, and the preset change range, the fault can be located based on the change in the signal in different states when the first signal, the first candidate signal, and the second candidate signal all meet the first preset condition. In this way, the fault can be located accurately. In this embodiment, the fault is located based on the change in the signal, to remedy the failure to locate the fault based on the only the signal sensed by the sensor. In this way, the fault can be accurately and easily located in a variety of complex scenarios. No additional fault detection device is involved, and the energy storage system can operate properly and reliably throughout, thereby facilitating troubleshooting.

Figure 7:
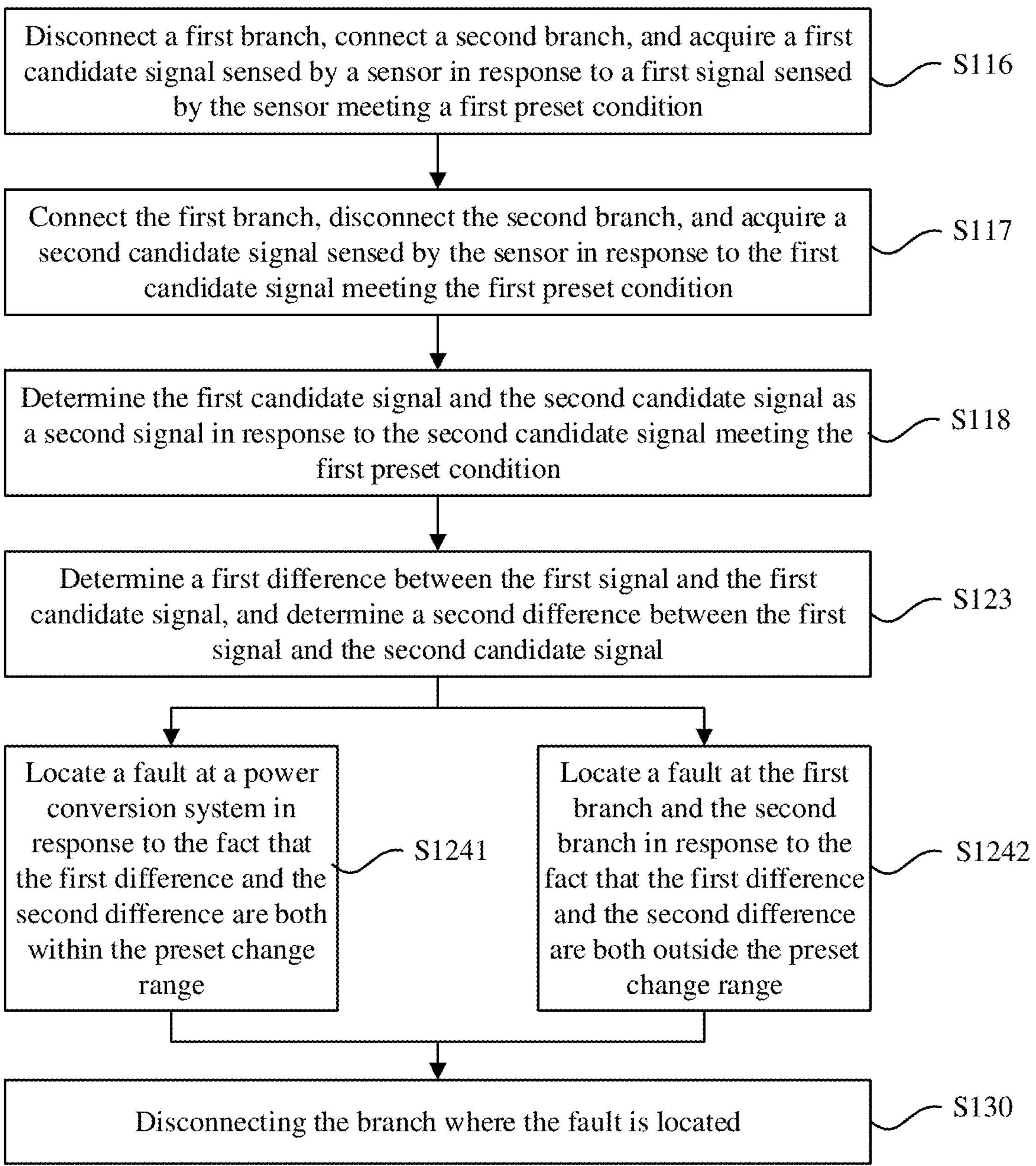
FIG. 7 is a flow chart illustrating the method for locating a fault in an embodiment.

In one embodiment, as shown in FIG. 7, the locating the fault according to the relationship between the first difference, the second difference and the preset change range includes the follows steps S1241 to S1242.

In step S1241, it is determined that the fault occurs in the power conversion system in response to the fact that the first difference and the second difference are both within the preset change range.

In step S1242, it is determined that the fault occurs in the first branch and the second branch in response to the fact that the first difference and the second difference are both outside the preset change range.

In the embodiment of the present disclosure, the fault is located according to the relationship between the first difference, the second difference and the preset change range. In response to the fact that the first difference and the second difference are both within the preset change range, it is confirmed that the change in the signal in different states is slight. That is, the signal sensed when the branch is disconnected is similar to the signal sensed when the branch is connected. In this case, it is determined that the fault occurs in the power conversion system. In one example, the energy storage system is shut down when the fault occurs in the power conversion system. In response to the fact that the first difference and the second difference are both outside the preset change range, it is confirmed that the signal is significantly different when one of the branches is disconnected. Although both the signal sensed when the branch is disconnected and the signal sensed when the branch is connected indicate the fault, the signal sensed when the branch is disconnected is significantly different from the signal sensed when the branch is connected. In this case, it is confirmed that both branches malfunction, that is, the fault is located in both the first branch and the second branch. In one example, when both the first branch and the second branch malfunction, the first branch and the second branch are disconnected. In an embodiment, an energy storage system that includes only two battery modules is shut down when both branches malfunction.

In the embodiment of the present disclosure, if the change is within the preset change range, the signal sensed when any branch is disconnected is similar to the signal sensed when the branch is connected, and then the fault occurs in the power conversion system. When the change is outside the preset change range, the signal sensed when any branch is disconnected is significantly different from the signal sensed when the branch is connected, and then both branches malfunction. That is, it is determined that the fault occurs in both the first branch and the second branch. In this embodiment, the preset change range is set based on the signal features corresponding to positions of the fault. The fault can be accurately located based on the first difference and the second difference, that is, in the branch or in the power conversion system, thereby facilitating subsequent removal of the fault. This solution is applicable to various scenarios.

Figure 8:
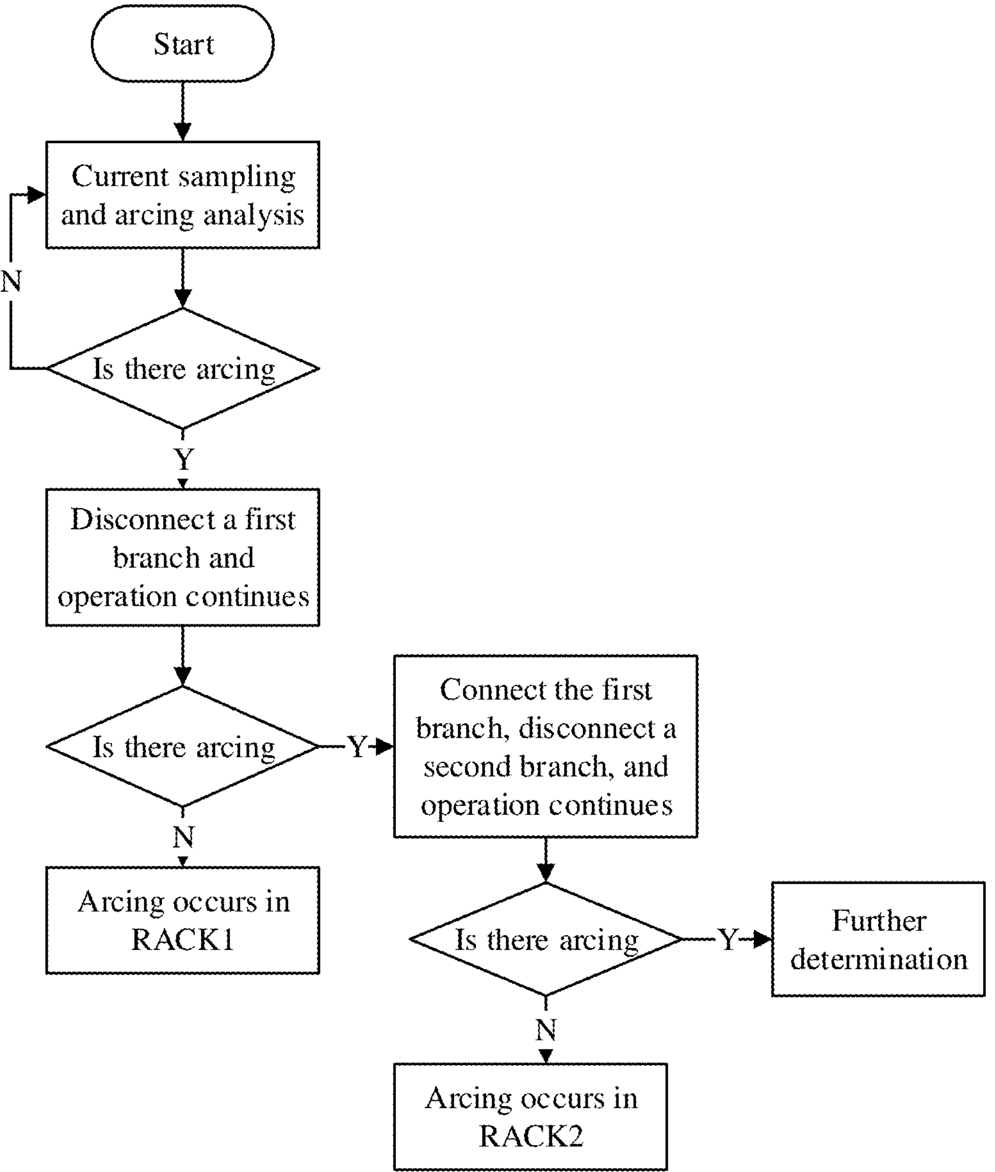
FIG. 8 is a flow chart illustrating the method for locating a fault in an embodiment.

FIG. 8 is a flow chart illustrating the method for locating a fault shown according to an embodiment. As shown in FIG. 8, the method according to this embodiment can be used to locate the arcing in a dual-branch PCS (which is a core component between the energy storage system and a power grid for regulating bidirectional conversion between alternating current power and direct current power, that is, the charging and discharging of the battery). Firstly, the current is sensed by the sensor and the alternating current component is extracted for detecting arcing. Success in detecting arcing means that the first signal detected by the sensor in the above embodiment meets the first preset condition. Subsequently, the main contactor 1 in the first branch is switched off, and the main contactor 2 in the second branch is still on. The system operates normally. The sensor resumes senses the signal for arcing detection. Failure to detect the arcing here means that the first candidate signal sensed by the sensor meets the second preset condition. In this case, the arcing occurs in the RACK1 branch. Alternatively, success in detecting the arcing here means that the first candidate signal sensed by the sensor meets the first preset condition. Then, the main contactor 1 in the first branch is switched on, and the main contactor 2 in the second branch is switched off. The system operates normally. The sensor resumes senses the signal for arcing detection. Failure to detect the arcing here means that the second candidate signal sensed by the sensor meets the second preset condition, and the RACK2 is short-circuited. Alternatively, success in detecting the arcing here means that the second candidate signal meets the first preset condition. Then, the locating the fault according to the first signal, the first candidate signal and the second candidate signal resumes. Reference is made to the above for further details.

In the embodiments of the disclosure, the fault in the dual-branch power conversion system can be located accurately for facilitating removal of the fault, with no reduction in the power production. Moreover, no additional sensor or fault detection device is involved, and the fault can be located at a low price.

It should be understood that although the steps in the flow chart involved in the above embodiments are shown in an order directed by the arrow, these steps are not necessarily performed in this order. Unless explicitly stated in the present disclosure, there is no restriction on the sequence of these steps. These steps can be performed in a different order. Moreover, at least some steps in the flow chart according to the above described embodiments may include multiple steps or phases. These steps or phases are not necessarily performed at the same time, but can be executed at different times. Further, these steps or phases are not necessarily performed sequentially. Instead, these steps or phases can be performed alternately.

Based on the same inventive concept, a device for performing the method for locating a fault mentioned above is further provided according to the embodiment of the present application. The solution to the problem here is similar to the above. Therefore, the device is not detailed herein, and reference can be made to the above embodiments for details.

Figure 9:
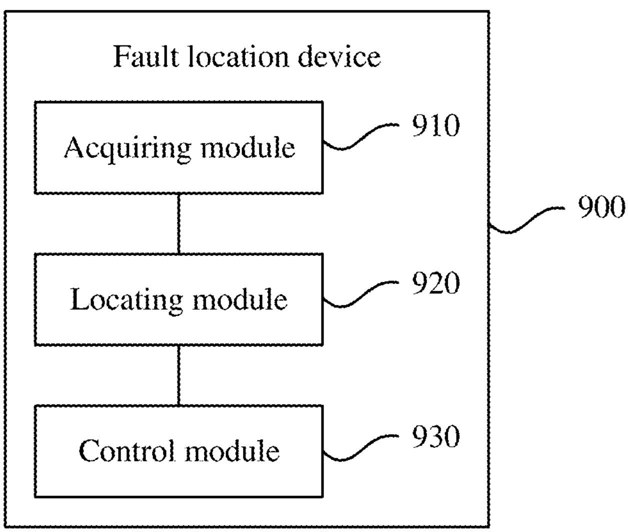
FIG. 9 is a structural block diagram illustrating the device for locating a fault in an embodiment.

In an embodiment, as shown in FIG. 9, there device 900 is applied to an energy storage system, which includes a first battery module, a second battery module, a sensor, and a power conversion system. A first branch where the first battery module is arranged and a second branch where the second battery module is arranged are connected in parallel and then are electrically connected to the sensor. The power conversion system is electrically connected to the first battery module and the second battery module. The device includes: an acquiring module 910 configured to switch the first branch and the second branch to a target state and acquire a second signal sensed by the sensor in the target state, in response to a first signal sensed by the sensor meeting a first preset condition; a locating module 920 configured to locate the fault according to the first signal and the second signal; and a control module 930 configured to disconnect a branch where the fault is located.

In an embodiment, the acquiring module includes: a first control submodule configured to disconnect the first branch, connect the second branch and acquire a first candidate signal sensed by the sensor; and a first determining submodule configured to determine the first candidate signal as the second signal, in response to the first candidate signal meeting a second preset condition. The locating module includes a second determining submodule configured to determine that the fault occurs in the first branch, in response to the first signal meeting the first preset condition and the second signal meeting the second preset condition.

In an embodiment, the control module includes a second control submodule configured to disconnect the first branch, connect the second branch and acquire a first candidate signal sensed by the sensor; a third control submodule configured to connect the first branch, disconnect the second branch and acquire a second candidate signal sensed by the sensor, in response to the first candidate signal meeting the first preset condition; and a third determining submodule configured to determine the second candidate signal as the second signal, in response to the second candidate signal meeting a second preset condition. The locating module includes a fourth determining submodule configured to determine that that the fault occurs in the second branch, in response to the first signal meeting the first preset condition and the second signal meeting the second preset condition.

In an embodiment, the second signal numbers more than one. The control module includes: a fourth control submodule configured to disconnect the first branch, connect the second branch and acquire a first candidate signal sensed by the sensor; a fifth control submodule configured to connect the first branch, disconnect the second branch and acquire a second candidate signal sensed by the sensor, in response to the first candidate signal meeting the first preset condition; and a fifth determining submodule configured to determine the first candidate signal and the second candidate signal as the second signal, in response to the second candidate signal meeting the first preset condition.

In an embodiment, the locating module includes: a sixth determining submodule configured to determine a first difference between the first signal and the first candidate signal, and determine a second difference between the first signal and the second candidate signal; and a seventh determining submodule configured to locate the fault according to a relationship between the first difference, the second difference and a preset change range.

In an embodiment, the seventh determining submodule includes: a first determining unit configured to determine that the fault occurs in the power conversion system in response to a fact that the first difference and the second difference are both within the preset change range; and/or a second determining unit configured to determine that the fault occurs in the first branch and the second branch in response to a fact that the first difference and the second difference are both outside the preset change range.

The modules in the above device as a whole or in part can be implemented by software, hardware and a combination of software and hardware. These modules may be embedded in or independent of a processor in a computer device in form of hardware, or stored in the memory in the computer device in form of software, for invocation by the processor to implements operations of the above modules.

Figure 10:
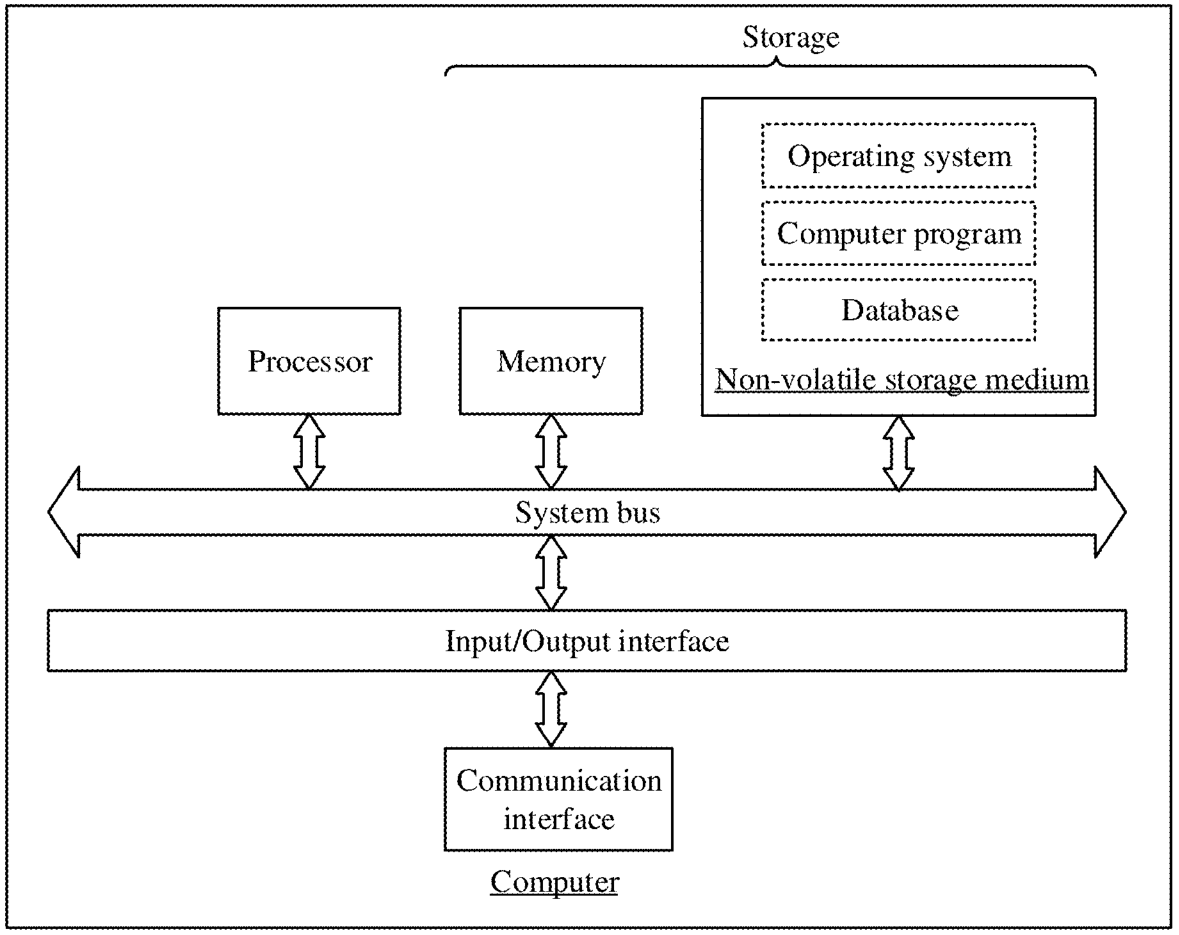
FIG. 10 is structural block diagram illustrating a computer device in an embodiment.

In an embodiment, a computer device is provided. The computer device may be a server, as shown in FIG. 10. The computer device includes a processor, a storage, an input/output (I/O) interface and a communication interface. The processor, the storage and the input/output interface are connected through a system bus. The communication interface is connected to the system bus through the input/output interface. The processor of the computer device provides computing and control functions. The storage of the computer device includes a nonvolatile storage medium and a memory. The non-volatile storage medium stores an operating system, a computer program, and a database. The memory provides a runtime system for the operating system and computer programs in the nonvolatile storage medium. The database of the computer device stores signals sensed by the sensor and other data involved in the method according to the embodiments. The processor and an external device exchange information through the input/output interface of the computer device. The communication interface of the computer device communicates with an external terminal through network. The computer program, when executed by the processor, implements a method for locating a fault.

It can be understood by those skilled in the art that FIG. 10 shows only some details related to the solution of the present application, and does not constitute a limitation on the computer device to which the solution of the present application is applied. In practice, the computer device may include more or less components than those shown in FIG. 10, or combine some components, or arrange components differently.

A computer device is also provided according to an embodiment of the present disclosure. The computer device includes a memory and a processor. The memory stores a computer program, and the processor executes the computer program to implement the method described above.

A computer-readable storage medium is also provided according to an embodiment of the present disclosure. The computer-readable storage medium has a computer program stored thereon. When the computer program is executed by a processor, the method described above is implemented.

A computer-readable storage medium is also provided according to an embodiment of the present disclosure. The computer-readable storage medium has a computer program stored thereon. When the computer program is executed by a processor, the method described above is implemented.

It should be noted that the user information (including but not limited to user equipment information, user personal information, etc.) and data (including but not limited to data for analysis, stored data, displayed data, etc.) involved in the present application are authorized by the user or fully authorized by all parties, and the collection, use and processing of relevant data should comply with relevant regulations.

Those skilled in the art should understand that all or part of the processes in the method of the above embodiments can be implemented by instructing the relevant hardware through a computer program. The computer program may be stored in a nonvolatile computer-readable storage medium. The computer program, when executed, implements the processes in the method of the above embodiments. The storage, database or other media described in the embodiments of the present application includes at least one of non-volatile and volatile memories. The non-volatile memory may include a read only memory (ROM), a magnetic tape, a floppy disk, a flash memory, an optical memory, a high-density embedded nonvolatile memory, a resistive random access memory (ReRAM), a magneto-resistive random access memory (MRAM), a ferroelectric random access memory (FRAM), a phase change memory (PCM), or a graphene memory, etc. The volatile memory may include a random access memory (RAM), an external cache memory or the like. As an illustration rather than a limitation, the RAM is in many forms, such as a static random access memory (SRAM) and a dynamic random access memory (DRAM). The database involved in the embodiments of the present application may include at least one of a relational database and a non-relational database. The non-relational database may include a blockchain based distributed database, etc., to which there is no limitation. The processor involved in the embodiments of the present application may be a general-purpose processor, a central processor, a graphics processor, a digital signal processor, a programmable logic device, a data processing logic device based on quantum computing, etc., to which there is no limitation.

The technical features of the above embodiments can be combined arbitrarily. In order to simplify the description, only some of the possible combinations of the technical features are described in the above embodiments. However, all the combinations of the technical features should fall within the scope of the present application in case of no conflict.

Only some embodiments of the present application have been described in detail above, and thus should not be construed as a limitation on the scope of the present application. It should be noted that for those skilled in the art can make several modifications and improvements without departing from the concept of the present application, which are within the scope of protection of the present application. Therefore, the scope of protection of the present application shall be subject to the appended claims.

The invention claimed is:

1. A method for locating a fault, wherein the method is applied to an energy storage system comprising a first battery module, a second battery module, a sensor, and a power conversion system, a first branch where the first battery module is arranged and a second branch where the second battery module is arranged are connected in parallel and are electrically connected to the sensor, the power conversion system is electrically connected to the first battery module and the second battery module, and the method comprises:

sensing, by the sensor, a first signal;

switching the first branch and the second branch to a target state and determining a second signal in the target state, when the meets a first preset condition, wherein the target state comprises an ON state and an OFF state, and the first preset condition is set based on signal features of faults to be located for determining whether a signal sensed by the sensor is a fault signal;

locating the fault according to a fault determination condition based on the first signal and the second signal, wherein the fault determination conditional is set based on signal features of faults at different positions; and disconnecting a branch where the fault is located.

2. The method according to claim 1, wherein the switching the first branch and the second branch to the target state and determining the second signal in the target state comprises:

switching the first branch to the OFF state, switching the second branch to the ON state, and sensing a first candidate signal by the sensor; and determining the first candidate signal as the second signal, when the first candidate signal meeting a second preset condition, the second preset condition is set based on signal features in case of no fault occurs for determining whether a signal sensed by the sensor is a non-fault signal, and the locating the fault according to the fault determination condition based on the first signal and the second signal comprises:

determining that the fault occurs in the first branch, when the first signal meeting the first preset condition and the second signal meeting the second preset condition.

3. The method according to claim 1, wherein the switching the first branch and the second branch to the target state and determining the second signal in the target state comprises:

switching the first branch, to the OFF state, switching the second branch to the ON state, and sensing a first candidate signal by the sensor;

switching the first branch to the ON state, switching the second branch to the OFF state, and sensing a second candidate signal by the sensor, when the first candidate signal meeting the first preset condition; and determining the second candidate signal as the second signal, when the second candidate signal meeting a second preset condition, and the locating the fault according to the fault determination condition based on the first signal and the second signal comprises:

determining that the fault occurs in the second branch, when the first signal meeting the first preset condition and the second signal meeting the second preset condition.

4. The method according to claim 1, wherein the number of the second signal numbers is multiple, and the switching the first branch and the second branch to the target state and determining the second signal in the target state comprises:

switching the first branch to the OFF state, switching the second branch to the ON state, and sensing a first candidate signal by the sensor;

switching the first branch to the ON state, switching the second branch to the OFF state, and sensing a second candidate signal by the sensor, when the first candidate signal meeting the first preset condition; and determining the first candidate signal and the second candidate signal as the second signal, when the second candidate signal meeting the first preset condition.

5. The method according to claim 4, wherein the locating the fault according to the fault determination condition based on the first signal and the second signal comprises:

determining a first difference between the first signal and the first candidate signal, and determining a second difference between the first signal and the second candidate signal; and locating the fault according to the fault determination condition based on the first signal and the second signal by;

determining that the fault occurs in the power conversion system in response to a fact that the first difference and the second difference are both within a preset change range; and determining that the fault occurs in the first branch and the second branch in response to a fact that the first difference and the second difference are both outside the preset change range.

6. A device for locating a fault, wherein the device is applied to an energy storage system comprising a first battery module, a second battery module, a sensor, and a power conversion system, a first branch where the first battery module is arranged and a second branch where the second battery module is arranged are connected in parallel and are electrically connected to the sensor, the power conversion system is electrically connected to the first battery module and the second battery module, the sensor senses a first signal, and the device comprises:

an acquiring module configured to switch the first branch and the second branch to a target state and determine a second signal in the target state, when the first signal meets a first preset condition, wherein the target state comprises an ON state and an OFF state, and the first preset condition is set based on signal features of faults to be located for determining whether a signal sensed by the sensor is a fault signal;

a locating module configured to locate the fault according to a fault determination condition based on the first signal and the second signal, wherein the fault determination conditional is set based on signal features of faults at different positions; and a control module configured to disconnect a branch where the fault is located.

7. A computer device, comprising:

a memory storing a computer program; and a processor configured to execute the computer program to perform the method according to claim 1.

8. A computer-readable storage medium storing a computer program, wherein the computer program, when being executed by a processor, implements the method according to claim 1.

9. A computer program product comprising a computer program, wherein the computer program, when being executed by a processor, implements the method according to claim 1.

* * * * *